(12) United States Patent
Jones

(10) Patent No.: US 7,364,620 B2
(45) Date of Patent: Apr. 29, 2008

(54) METHOD OF PURIFYING ALKALINE-EARTH AND ALKALI-EARTH HALIDES FOR CRYSTAL GROWTH

(75) Inventor: Christopher Daniel Jones, Milford, NH (US)

(73) Assignee: Saint-Gobain Ceramics & Plastics, Inc., Worcester, MA (US)

( * ) Notice: Subject to any disclaimer, the term of this patent is extended or adjusted under 35 U.S.C. 154(b) by 300 days.

(21) Appl. No.: 10/977,523

(22) Filed: Oct. 28, 2004

(65) Prior Publication Data

US 2006/0090690 A1    May 4, 2006

(51) Int. Cl.
*C30B 13/02*    (2006.01)

(52) U.S. Cl. .............................. 117/81; 117/82; 117/83; 117/940

(58) Field of Classification Search .................. 117/81, 117/82, 83, 940
See application file for complete search history.

(56) References Cited

U.S. PATENT DOCUMENTS

| | | | |
|---|---|---|---|
| 2,550,173 | A | 4/1951 | Swinehart et al. |
| 3,935,302 | A | 1/1976 | Pastor et al. |
| 6,238,479 | B1 | 5/2001 | Oba |
| 6,773,501 | B2 | 8/2004 | Kerdoncuff et al. |
| 2003/0217688 | A1* | 11/2003 | Meyer-Fredholm et al. .. 117/13 |

OTHER PUBLICATIONS

Pastor, R.C. et al. "Crystal growth of alkaline earth fluorides in a reactive atmosphere." Materials Research Bulletin USA. 10.6 (Jun. 1975): 493-500. XP002381050.
Written Opinion from International Patent Application No. PCT/US2005/037892.
R. C. Pastor et al., Crystal Growth of Alkaline Earth Fluorides in a Reactive Atmosphere PART II, Mat. Res. Bull., vol. 11, pp. 1037-1042, 1976. (XP 002381051).

* cited by examiner

*Primary Examiner*—Robert Kunemund
(74) *Attorney, Agent, or Firm*—Renner, Otto, Boisselle, Sklar LLP

(57) ABSTRACT

An improved technique that reduces the potential for trapped impurities and/or ensuring desired stoichiometry of a grown crystal. Improved contaminant removal is obtained by bubbling a scavenger gas, such as fluorine gas or hydrogen fluoride gas, through a melt of alkaline- or alkali-earth halides, to improve the purity of the melt by removing more volatile metal halides and oxygen contained within the melt. By reacting after the raw material has melted, any oxygen or metal impurities trapped in the raw material is free to react with the scavenger. A desired stoichiometry is achieved as the alkaline- or alkali-earth metals react with the halide in the scavenger gas. Decreasing the amount of impurities in the melt, and using a desired stoichiometeric melt, improves the radiation hardness and transmission properties of resulting ingot grown from the purified raw material. Additionally, this method may decrease the amount of time needed for outgassing. The method may also be used to form a high purity pre-melt, which in turn may be used to grow an ingot with higher purity.

20 Claims, No Drawings

METHOD OF PURIFYING ALKALINE-EARTH AND ALKALI-EARTH HALIDES FOR CRYSTAL GROWTH

The invention herein described relates generally to a method of synthesizing a growth material used to form halide crystals and particularly single crystals of fluorides, such as calcium fluoride and barium fluoride, that are particularly suited for high purity applications such as optical elements having excellent transmission properties.

BACKGROUND

The growth of large essentially single crystal ingots of various inorganic salts for use as optical bodies has been the focus of much attention over the past several decades. Among the salts especially suited for use as lenses over a wide range of wavelengths of radiation are the alkaline-earth metal halides. For many applications including, in particular, lenses used at wavelengths of 157 and 193 nm in photolithography equipment, a highly transparent, strain free and radiation hard single crystal, particularly of calcium or barium fluoride, is required. Another application that this technique is particularly suited for are scintillation crystals, such as NaI(TI) or CsI(TI), where oxygen impurities may act as sites where electrons are trapped.

Radiation hardness of a crystal is dependent on both the intrinsic properties of the crystal and the type and quantity of impurities in the crystal. Metallic impurities and oxygen within an alkaline- or alkali-earth halide crystal are known to decrease the radiation hardness of the crystal.

Radiation hardness may be defined as damage in a crystal resulting from exposure to energy that reduces the transmission of the crystal. It is also necessary to have a stoichiometric crystal as close to possible to theoretical to ensure good radiation hardness. In the case of alkaline-earth fluorides, this means two fluorine atoms for each alkaline-earth atom. In the case of alkali-earth fluorides, this means one fluorine atom for each alkali-earth atom. A desired stoichiometry is one that does not give unwanted absorbances at any wavelength, other than intrinsic absorbances.

In the present art, metals are removed by precipitation methods before converting compounds to the fluoride. Precipitation techniques are expensive and time consuming due to yield losses and manpower.

Oxygen is removed in alkaline- and alkali-earth halides by outgassing (heating under vacuum), which is a time consuming process. Some degassing occurs when a calcium/barium fluoride charge in a crucible is heated under vacuum and the absorbed species leaves by desorption. Although this heating under vacuum removes many of the unwanted contaminants, further improvements to the degassing are achieved when scavenging agents are added. In the present art, a scavenger is used to react with oxygen, which might be present in the raw material and crucible, to form a volatile oxygen compound that is exhausted from the crucible. Typical scavenging agents for alkaline- or alkali-earth fluorides include metal fluorides, hydrogen fluoride gas, polytetrafluoroethylene and carbon tetrafluoride. Perhaps the most widely used scavenging agent is lead fluoride.

Lead fluoride is typically added to the alkaline- or alkali-earth metal fluoride charge in quantities from 1 to 3 weight percent. The lead fluoride is added as a powder and is mechanically mixed with the alkaline- or alkali-earth metal fluorides such that it is uniformly dispersed to the extent possible. At high temperature, typically greater than 600° C., the lead fluoride begins to substantially volatize. Any oxygen, water, sulfur, sulfate species, as examples, can react with the lead fluorides and be exhausted as volatile lead compounds. This reduces the impurities in the charge and makes for products with improved characteristics of transparency, strain and radiation hardness.

Many of the contaminants in the alkaline- or alkali-earth metal fluorides may not be on the surface or may not reach the surface for discharge before the charge becomes molten and the crystal is grown. Consequently, impurities can still be trapped in the crystal, thereby degrading the final product.

U.S. Pat. No. 3,935,302 disclosed an attempt to provide single crystal refractory metal halides and rare earth halides for use as laser windows having excellent mechanical, thermal and optical properties. As described in this patent, laser windows were prepared from halide crystals purified by congruent growth from a melt using a reactive atmospheric processing method.

SUMMARY OF THE INVENTION

The present invention provides an improved technique that further reduces the potential for trapped impurities when applied to prior crystal growth techniques. In accordance with the invention, improved contaminant removal is obtained by bubbling a scavenger gas that removes oxygen and/or adds a particular halide to the melt. In the case of calcium fluoride for example, a scavenger gas, such as fluorine gas, hydrogen fluoride gas, nitrogen trifluoride gas, carbon tetrafluoride gas, or mixtures thereof, is bubbled through the melt to improve the purity of the melt by removing more volatile metal fluorides and oxygen contained within the melt. By reacting after the raw material has melted, any oxygen or metal impurities trapped in the raw material is free to react with the scavenger. Decreasing the amount of impurities in the melt improves the radiation hardness and transmission properties of the resulting ingot grown from the purified raw material. Additionally, this method may decrease the amount of time needed for outgassing. The method may also be used to form a high purity pre-melt, which in turn may be used to grow an ingot with higher purity. The method can be used with any alkaline- or alkali-earth halide and an appropriate scavenger gas.

The present invention also provides an improved technique that can further improve the stoichiometry of the melt. During raw material processing, it is possible that the raw material never achieves the desired stoichiometry due to impurities, reaction conditions, and electrochemical processes. One cause of non-stoichiometry in alkaline- or alkali-earth halides is halide deficiency. The bubbling of scavenger gas through a melt has the ability of correcting the non-stoichiometry by adding halides to the melt.

Accordingly, the invention provides a method of purifying a growth material used to form halide crystals, comprising the steps of: heating a growth material comprising an alkaline- or alkali-earth fluoride to form a melt; and introducing a scavenger gas into the melt thereby to improve the purity of the melt by removing volatile metal halides and oxygen contained within the melt. The heating and introduction of the scavenger gas preferably are conducted in an enclosed space from which is exhausted the reaction gases produced by reaction of the scavenger gas with impurities in the growth material.

According to another aspect of the invention, there is provided a method of improving a growth material used to form halide crystals, comprising the steps of: heating a growth material comprising an alkaline- or alkali-earth fluoride to form a melt; and introducing a gas into the melt thereby to improve the stoichiometry of the melt by adding halides to the melt. The heating and introducing of the scavenger gas preferably are conducted in an enclosed space from which is exhausted the reaction gases produced by reaction of the scavenger gas with impurities in the growth material.

The scavenger or halide-containing gas can be selected from a preferred group consisting of fluorine gas, hydrogen fluoride gas, nitrogen trifluoride, carbon tetrafluoride, sulfur hexafluoride, trifluoromethane, iodine gas, hydrogen iodide, tetraiodomethane, triiodomethane, bromine gas, hydrogen bromide, tetrabromomethane, chlorine gas, hydrogen chloride gas, tetrachloromethane gas, trichloromethane gas, and mixtures thereof; and the growth material can be selected from a preferred group consisting of calcium fluoride, barium fluoride, magnesium fluoride, lithium fluoride and strontium fluoride, sodium fluoride, cesium fluoride, lithium fluoride, calcium chloride, barium chloride, magnesium chloride, strontium chloride, sodium chloride, lithium chloride, cesium chloride, calcium bromide, barium bromide, magnesium bromide, strontium bromide, sodium bromide, lithium bromide, cesium bromide, calcium iodide, barium iodide, magnesium iodide, strontium iodide, sodium iodide, lithium iodide, cesium iodide, and mixtures thereof.

The invention may also encompass a step of cooling the melt to form a pre-growth material that can be subsequently reheated to form a melt from which a crystal can be grown. The pre-growth material can be in the form of a slab or pancake, or in the form of spheres.

The invention further provides a purified and/or improved crystal growth material obtained by the foregoing methodology, a method of growing a halide crystal comprising the step of growing a halide crystal from the purified/improved growth material, and a halide crystal resulting from such growth.

The foregoing and other features of the invention are hereinafter more fully described and particularly pointed out in the claims, the following description setting forth in detail certain illustrative embodiments of the invention, these being indicative, however, of but a few of the various ways in which the principles of the invention may be employed.

DETAILED DESCRIPTION

As above indicated, the present invention provides an improved technique that further reduces the potential for trapped impurities and/or provides a desired stoichiometry of the melt when applied to prior crystal growth techniques. This technique can be applied to conventional methods for synthesizing alkaline- or alkali-earth metal halides growth stock and particularly those methods which employ a scavenger to remove impurities, in particular oxygen, from the growth stock, as is desired to provide a radiation hard, highly transmissive crystal. Heretofore, a scavenger, such as lead fluoride, would be added to the alkaline- or alkali-earth metal halides, such as a calcium fluoride charge, in quantities from 1 to 3 weight percent. The lead fluoride typically is added as a powder and is mixed with the alkaline- or alkali-earth metal halides such that it is uniformly dispersed to the extent possible.

At high temperature, typically greater than 600° C., the lead fluoride begins to substantially volatize. Any oxygen, water, sulfur, sulfate species, as examples, can react with the lead fluorides and be exhausted as volatile lead compounds. This reduces the impurities in the charge and makes for products with improved characteristics of transparency, strain and radiation hardness.

Many of the contaminants in the alkaline- or alkali-earth metal halides may not be on the surface or may not reach the surface for discharge before the charge is molten and the crystal is grown. Consequently, impurities can still be trapped in the crystal, thereby degrading the final product.

The present invention provides a method for discharging the previously unreachable contaminants. This is accomplished by bubbling a scavenger gas through a melt of the alkaline- or alkali-earth metal halides to improve the purity of the melt by removing more volatile metal halides and oxygen contained within the melt. By reacting after the raw material has melted, any oxygen or metal impurities trapped in the raw material is free to react with the scavenger gas. Additionally, any deviation from desired stoichiometry is corrected, as the alkaline- or alkali-earth metal halides can react with additional halides made available by the scavenger gas.

To facilitate an understanding of the invention, an exemplary process will now be described. Initially, a growth material, typically in powder form, is loaded into a growth crucible. The crucible can be made of a conventional material, such as graphite. The crucible can be any size that is practical and can fit within the confines of the growth furnace being used. Examples of growth furnaces are Stockbarger, Czochralski, Kyropolous, heat-exchange method, etc.

The powder is then heated in the growth furnace until it is molten under vacuum, and a scavenger gas is bubbled through the melt. The scavenger gas can be supplied through a tube inserted into the melt. The tube should be made of a material, such as graphite, that does not react with the molten fluoride or the scavenger gas. The tube, for example, can be a hollow graphite tube that is inserted through a probe hole in a wall of the growth furnace. The graphite tube can be connected to source of the scavenger gas and the rate of bubbling can be controlled by the gas flow. The end of the tube may or may not be equipped with a gas diffuser, as desired. The tube can be inserted into the melt until the end of the tube that exhausts the gas is near the bottom of the melt. As the gas exits the tube, it will bubble up through the melt.

Bubbling preferably is allowed to continue for a sufficient time to effect removal of most, if not all, of the impurities in the melt. The amount of time necessary to remove all the targeted impurities can be determined by the amount of impurities in the starting raw material and the mass of the charge.

This bubbling technique can be performed under vacuum, reduced pressure, or at elevated pressures. Gas flows in between 0.001 cc/min to 1000 L/min can be used in accordance with this invention, however typically a gas flow of about 10 cc/min for about 1 hour should be sufficient to remove most of the impurities.

Commercially available growth materials, commonly referred to as "raw" materials, contain impurities including, in particular, chromium (Cr), iron (Fe), lead (Pb), lithium (Li), magnesium (Mg), manganese (Mn), potassium (K), silicon (Si), aluminum (Al), sodium (Na), sulphur (S), strontium (Sr), zirconium (Zr) and zinc Zn). The present invention is particularly useful in removing sodium, silicon, aluminum, iron and zinc. Preferably the scavenger gas is introduced into the melt for a period of time sufficient to reduce the concentration of one or more of the impurities in the growth material, particularly sodium, silicon, aluminum, iron and/or zinc, by at least about 25% and more preferably at least by about 50%. Moreover, the scavenger gas can be introduced into the melt for a period of time sufficient to reduce the impurities to a level less than previously obtainable in the prior art. For example, the presence of sodium in the growth material can be reduced to less than 2.5 parts per million, more preferably less than about 2.0 parts per million, and still more preferably less than about 1.8 parts per million. By way of further example, the presence of silicon in the growth material can be reduced to less than 1.4 parts per million, more preferably less than about 1.0 part per million, and still more preferably less than about 0.7 parts per million. As it is difficult and impractical to measure the concentration of an impurity in the melt, the herein referenced concentrations are those obtained by measuring the concentration of the impurity in a solidified pre-growth material that has been processed in accordance with the invention or in a crystal grown from a growth material processed in accordance with the invention. Thus, for example, the gas is introduced into the melt for a period of time sufficient to reduce the presence of silicon in the growth crystal to less than 1.4 parts per million, more preferably less than about 1.0 part per million, and still more preferably less than about 0.7 parts per million.

The hereindescribed technique can also be applied using one or more of a variety of spargers. For example, the container can have an inner bottom wall defining with the bottom of the container a plenum into which the scavenger gas is supplied under pressure sufficient to allow the gas to enter the melt. The inner bottom wall can be provided with a plurality of holes through which the gas can enter the chamber containing the molten growth material to be purified, whereupon the gas will bubble up through the melt. The container alternatively or additionally can be equipped with a sparger located at the bottom of the melt chamber for injecting the scavenger gas into melt.

If the crucible is sealed, the top thereof can be equipped with an exhaust port connected to a source of vacuum for withdrawing the reaction gases from the crucible. If the crucible is instead placed in a sealed furnace, the furnace can be equipped with an exhaust port connected to a source of vacuum for withdrawing the reaction gases from the furnace.

After the bubbling process, the scavenger gas flow is stopped and any utilized gas injector, such as the aforesaid hollow graphite tube, can be removed from the melt. At this point a crystal can be grown using any suitable growth process. Alternatively, the melt can be used to form a pre-growth material that can later be added to a growth furnace for subsequent melting followed by crystal growth. The use of pre-growth material is well known in the art to increase the charge density with a growth crucible, decrease outgassing time in the furnace, and/or as an additional purification step in the overall crystal growth process.

Several specific examples will now be described.

EXAMPLE 1

80 kg of calcium fluoride powder is added into a crucible and loaded into crystal growth furnace. The powder is slowly heated until melted under vacuum using known outgassing techniques. Hydrogen fluoride gas in bubbled into the bottom of the melt through a graphite pipe at a rate of 10 cc/min for 1 hour. After the gas treatment is finished, the graphite pipe is removed from the melt. A crystal is then grown using the Stockbarger crystal growth technique, and cooled using a standard annealing process.

EXAMPLE 2

60 kg of calcium fluoride powder is added into a crucible and loaded into crystal growth furnace. The powder is slowly heated until melted under vacuum using known outgassing techniques. Hydrogen fluoride gas in bubbled into the bottom of the melt through a graphite pipe at a rate of 1 cc/min for 10 hour. After the gas treatment is finished, the graphite pipe is removed from the melt. A crystal is then grown using the Stockbarger crystal growth technique, and cooled using a standard annealing process.

EXAMPLE 3

80 kg of calcium fluoride powder is added into a crucible and loaded into a furnace. The powder is slowly heated until melted under vacuum using known outgassing techniques. Hydrogen fluoride gas in bubbled into the bottom of the melt through a graphite pipe at a rate of 10 cc/min for 1 hour. After the gas treatment is finished, the graphite pipe is removed from the melt. The melt is slowly cooled to produce a densified raw material. This densified raw material is then loaded into a crystal growth furnace and melted. A crystal is then grown using the Stockbarger crystal growth technique, and cooled using a standard annealing process.

Modifications, changes and improvements to the preferred forms of the invention herein disclosed, described and illustrated may occur to those skilled in the art who come to understand the principles and precepts thereof. Accordingly, the scope of the patent to be issued hereon should not be limited to the particular embodiments of the invention set forth herein.

What is claimed is:

1. A method of treating a growth material used to form halide crystals, comprising the steps of:
    heating a growth material comprising an alkaline- or alkali-earth halide to form a melt; and
    bubbling a scavenger gas through the melt.

2. A method as set forth in claim 1, wherein the scavenger gas is bubbled through the melt for a period of time sufficient to reduce the presence of sodium in the growth material to less than 2.5 parts per million.

3. A method as set forth in claim 1, wherein the scavenger gas is bubbled through the melt for a period of time sufficient to reduce the presence of sodium in the growth material to less than about 2.0 parts per million.

4. A method as set forth in claim 1, wherein the scavenger gas is bubbled through the melt for a period of time sufficient to reduce the presence of sodium in the growth material to less than about 1.8 parts per million.

5. A method as set forth in claim 1, wherein the scavenger gas is bubbled through the melt for a period of time sufficient to reduce the presence of silicon in the growth material to less than 1.4 parts per million.

6. A method as set forth in claim 1, wherein the scavenger gas is bubbled through the melt for a period of time sufficient to reduce the presence of silicon in the growth material to less than about 1.0 parts per million.

7. A method as set forth in claim 1, wherein the scavenger gas is bubbled through the melt for a period of time sufficient to reduce the presence of silicon in the growth material to less than about 0.7 parts per million.

8. A method as set forth in claim 1, wherein the growth material prior to being melted contains at least one impurity, and scavenger gas is bubbled through the melt for a period of time sufficient to reduce the concentration of the impurity in the growth material by at least about 25%.

9. A method as set forth in claim 8, wherein the impurity is at least one of sodium, silicon, aluminum, iron and zinc.

10. A method as set forth in claim 1, wherein the growth material prior to being melted contains at least one impurity, and scavenger gas is bubbled through the melt for a period of time sufficient to reduce the concentration of the impurity in the growth material by at least about 50%.

11. A method as set forth in claim 10, wherein the impurity is at least one of sodium, silicon, aluminum, iron and zinc.

12. A method as set forth in claim 1, wherein the growth material is selected from a group consisting of calcium fluoride, barium fluoride, magnesium fluoride, strontium fluoride, sodium fluoride, cesium fluoride and lithium fluoride, calcium chloride, barium chloride, magnesium chloride, strontium chloride, sodium chloride, lithium chloride, cesium chloride, calcium bromide, barium bromide, magnesium bromide, strontium bromide, sodium bromide, lithium bromide, cesium bromide, calcium iodide, barium iodide, magnesium iodide, strontium iodide, sodium iodide, lithium iodide, cesium iodide, and mixtures thereof.

13. A method of growing a halide crystal, comprising the step of growing a halide crystal from the purified growth material obtained in accordance with the method of claim 12.

14. A method as set forth in claim 1, wherein the growth material is loaded into and heated in a crucible, the crucible is heated within an enclosed space, and reaction gases produced by reaction of the scavenger gas with impurities in the growth material are exhausted from the enclosed space.

15. A method as set forth in claim 1, further comprising the step of cooling the melt to form a pre-growth material that can be subsequently reheated to form a melt from which a crystal can be grown.

16. A method as set forth in claim 15, further comprising the step of loading the pre-growth material in a crucible, heating the crucible to melt the pre-growth ingot, and growing a crystal from the melt.

17. A method as set forth in claim 1, wherein the heating step includes heating the alkaline- or alkali-earth halide in an enclosed space, and further comprising the step of exhausting from the enclosed space reaction gases produced by reaction of the scavenger gas with impurities in the growth material.

18. A method as set forth in claim 1, wherein the scavenger gas is selected from a group consisting of fluorine gas, hydrogen fluoride gas, nitrogen trifluoride, carbon tetrafluoride, sulfur hexafluoride, trifluoromethane, iodine gas, hydrogen iodide, tetraiodomethane, triiodomethane, bromine gas, hydrogen bromide, tetrabromomethane, chlorine gas, hydrogen chloride gas, tetrachloromethane gas, trichloromethane gas, and mixtures thereof.

19. A method as set forth in claim 1, wherein the growth material is selected from a group consisting of calcium fluoride, barium fluoride, magnesium fluoride, strontium fluoride, sodium fluoride, cesium fluoride and lithium fluoride, and mixtures thereof.

20. A method of growing a fluoride crystal, comprising the step of growing a fluoride crystal from the purified growth material obtained in accordance with the method of claim 19.

* * * * *